(12) United States Patent
Zhang et al.

(10) Patent No.: US 12,081,212 B2
(45) Date of Patent: Sep. 3, 2024

(54) REDRIVER AND RESISTIVE TERMINATION UNIT FOR A REDRIVER

(71) Applicant: NXP USA, Inc., Austin, TX (US)

(72) Inventors: Xu Zhang, Chandler, AZ (US); Siamak Delshadpour, Phoenix, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/990,603

(22) Filed: Nov. 18, 2022

(65) Prior Publication Data

US 2024/0171175 A1 May 23, 2024

(51) Int. Cl.
*H03K 17/687* (2006.01)
*H03H 11/02* (2006.01)

(52) U.S. Cl.
CPC ......... *H03K 17/6872* (2013.01); *H03H 11/02* (2013.01)

(58) Field of Classification Search
CPC ........................... H03K 17/6872; H03H 11/02
See application file for complete search history.

(56) References Cited

U.S. PATENT DOCUMENTS

| 4,625,271 | A | 11/1986 | Chetty et al. |
| 6,411,122 | B1 * | 6/2002 | Mughal ............... H04L 25/0278 326/86 |
| 7,009,827 | B1 | 3/2006 | Lee et al. |
| 7,884,637 | B2 * | 2/2011 | Jeong ................... G11C 7/1057 326/26 |
| 8,212,587 | B2 * | 7/2012 | Yeung ................. H04L 25/0286 326/82 |
| 10,498,330 | B1 | 12/2019 | Delshadpour et al. |
| 10,812,067 | B1 * | 10/2020 | Delshadpour ....... H04L 25/0298 |
| 2014/0253206 | A1 * | 9/2014 | Tang ...................... H03H 11/04 327/311 |
| 2020/0304088 | A1 * | 9/2020 | Khan. P ................. H03K 21/38 |

* cited by examiner

*Primary Examiner* — Ryan Johnson
*Assistant Examiner* — Colleen J O Toole

(57) ABSTRACT

Embodiments of redrivers and resistive termination units for redrivers are disclosed. In an embodiment, a resistive termination unit for a redriver includes a resistor connected to an input/output terminal of the redriver, a first switch connected to the resistor and to a supply voltage of the redriver, a second switch connected to the first switch and configured to be turned on or off in response to a change in the supply voltage of the redriver, and a control circuit connected to the first switch through the second switch and configured to generate a control signal for the first switch.

20 Claims, 8 Drawing Sheets

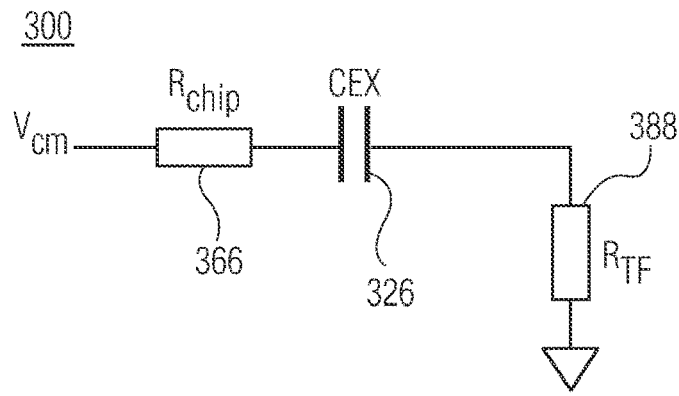
FIG. 3
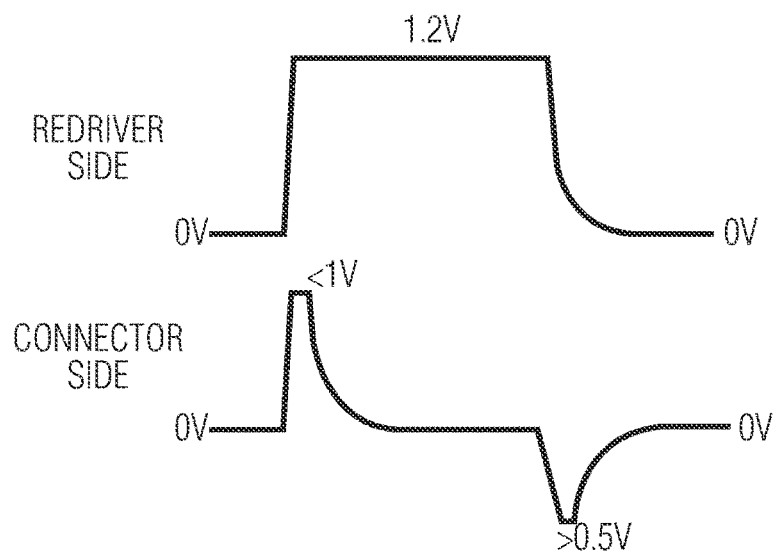
FIG. 4
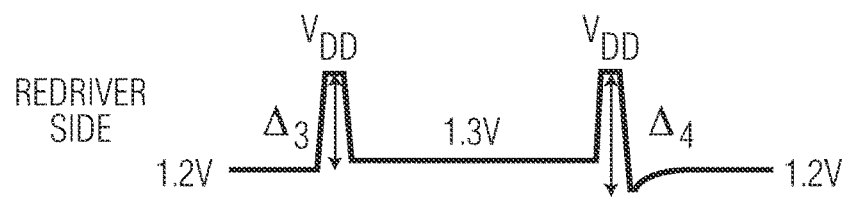
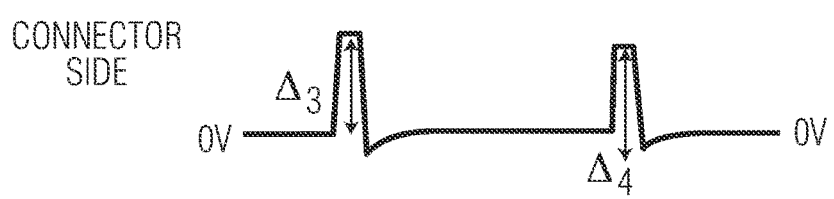
FIG. 5

REDRIVER AND RESISTIVE TERMINATION UNIT FOR A REDRIVER

BACKGROUND

A redriver can be used to provide signal amplification and/or waveform shaping such that a transmitted signal behaves as intended over long channels. For example, a redriver can be used to reduce insertion loss. However, supply voltage ramp-up or supply voltage ramp-down may cause an abrupt voltage change at one or more input terminals and/or output terminals of a redriver. For example, switching from no supply voltage (zero volts) to maximum supply voltage or from maximum supply voltage to no supply voltage (zero volts) may cause an abrupt voltage change at one or more input/output terminals of a redriver. Typically, an input/output terminal of a redriver is electrically connected to a decoupling capacitor with a large capacitance value, which can isolate the direct current (DC) level of the redriver input/output from an Integrated Circuit (IC) chip electrically connected to the redriver that is situated in the signal path. Because of the large capacitance value of the decoupling capacitor, an abrupt voltage change at an input/output terminal of a redriver can damage a connected IC chip if the acceptable absolute maximum voltage of the connected IC chip is lower than a voltage at the input/output terminal as a result of the abrupt voltage change. Therefore, there is a need for voltage change control technology that can provide a safe and robust solution to avoid an abrupt voltage change at the input/output terminals of a redriver during a supply voltage ramp-up or ramp-down.

SUMMARY

Embodiments of redrivers and resistive termination units for redrivers are disclosed. In an embodiment, a resistive termination unit for a redriver includes a resistor connected to an input/output terminal of the redriver, a first switch connected to the resistor and to a supply voltage of the redriver, a second switch connected to the first switch and configured to be turned on or off in response to a change in the supply voltage of the redriver, and a control circuit connected to the first switch through the second switch and configured to generate a control signal for the first switch. Other embodiments are also described.

In an embodiment, the resistive termination unit further includes a second control circuit configured to generate a second control signal for turning on or off the second switch in response to the change in the supply voltage of the redriver.

In an embodiment, the second control circuit includes a capacitor, a third switch, a plurality of inverters, and an OR gate.

In an embodiment, the capacitor is connected to the supply voltage of the redriver, where the third switch is connected between the capacitor and a reference voltage, and where the inverters are connected between the capacitor, the third switch, and the OR gate.

In an embodiment, the third switch includes a transistor, and a power good signal or a power-on reset (POR) signal of the redriver is applied to a gate terminal of the transistor.

In an embodiment, the control circuit is connected to a body of the first switch (e.g., the bulk of a metal-oxide semiconductor field-effect transistor (MOSFET)) and configured to generate a second control signal for a body terminal or pin of the first switch (e.g., the body terminal of a MOSFET).

In an embodiment, the second switch includes a transmission gate.

In an embodiment, the resistive termination unit further includes a second control circuit configured to generate a second control signal and a third control signal for turning on or off the transmission gate in response to the change in the supply voltage of the redriver, and where the second control signal is an inverted version of the third control signal.

In an embodiment, the resistive termination unit further includes a diode device connected to the first switch and to the transmission gate.

In an embodiment, the resistive termination unit further includes a capacitor connected between the first switch and a reference voltage.

In an embodiment, the reference voltage is zero volt.

In an embodiment, the first switch includes a P-channel metal-oxide-semiconductor field-effect transistor (MOSFET) (PMOS) transistor, and the second switch is connected to a gate terminal of the PMOS transistor.

In an embodiment, the change in the supply voltage of the redriver includes a ramp up event in which the supply voltage of the redriver increases from zero volt to a predefined voltage threshold.

In an embodiment, the change in the supply voltage of the redriver includes a ramp down event in which in which the supply voltage of the redriver decreases from a predefined voltage threshold to zero volt.

In an embodiment, the supply voltage of the redriver includes a DC voltage.

In an embodiment, a resistive termination unit for a redriver includes a resistor connected to an input/output terminal of the redriver, a PMOS transistor connected to the resistor and a supply DC voltage of the redriver, a transmission gate connected to a gate terminal of the PMOS transistor and configured to be turned on or off in response to a change in the supply DC voltage of the redriver, and a control circuit connected to the PMOS transistor through the transmission gate and configured to generate a control signal for the PMOS transistor.

In an embodiment, the resistive termination unit further includes a second control circuit configured to generate a second control signal and a third control signal for turning on or off the transmission gate in response to the change in the supply DC voltage of the redriver, and the second control signal is an inverted version of the third control signal.

In an embodiment, the resistive termination unit further includes a diode device connected to the PMOS transistor and to the transmission gate and a capacitor connected between the PMOS transistor and ground.

In an embodiment, the change in the supply voltage of the redriver includes a ramp up event in which the supply DC voltage of the redriver increases from zero volt to a predefined voltage threshold or a ramp down event in which in which the supply DC voltage of the redriver decreases from the predefined voltage threshold to zero volt.

In an embodiment, a redriver includes a Continuous Time Linear Equalizer (CTLE) configured to perform signal equalization, a transmitter driver configured to generate a driver signal in response to the signal equalization, a first resistive termination unit connected to the transmitter driver and to a first input/output terminal of the redriver, and a second resistive termination unit connected to the transmitter driver and to a second input/output terminal of the redriver. The first resistive termination unit includes a first resistor connected to the first input/output terminal of the redriver, a first PMOS transistor connected to the first resistor and a supply voltage of the redriver, a first switch connected to a gate terminal of the first PMOS transistor and configured to be turned on or off in response to a change in the supply voltage of the redriver, and a first control circuit connected to the first PMOS transistor through the first switch and configured to generate a first control signal for the first PMOS transistor. The second resistive termination unit includes a second resistor connected to the second input/output terminal of the redriver, a second PMOS transistor connected to the second resistor and the supply voltage of the redriver, a second switch connected to a gate terminal of the second PMOS transistor and configured to be turned on or off in response to the change in the supply voltage of the redriver, and a second control circuit connected to the second PMOS transistor through the second switch and configured to generate a second control signal for the second PMOS transistor.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 3 depicts a simplified voltage jump model of the redriver depicted in FIG. 2.

FIG. 4 depicts some examples of redriver side and connector side voltages of the redriver depicted in FIG. 2 under the simplified voltage jump model depicted in FIG. 3.

FIG. 5 depicts some examples of redriver side and connector side voltages of the redriver depicted in FIG. 2 under the simplified voltage jump model depicted in FIG. 3 in case of a supply voltage ramp up or ramp down.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
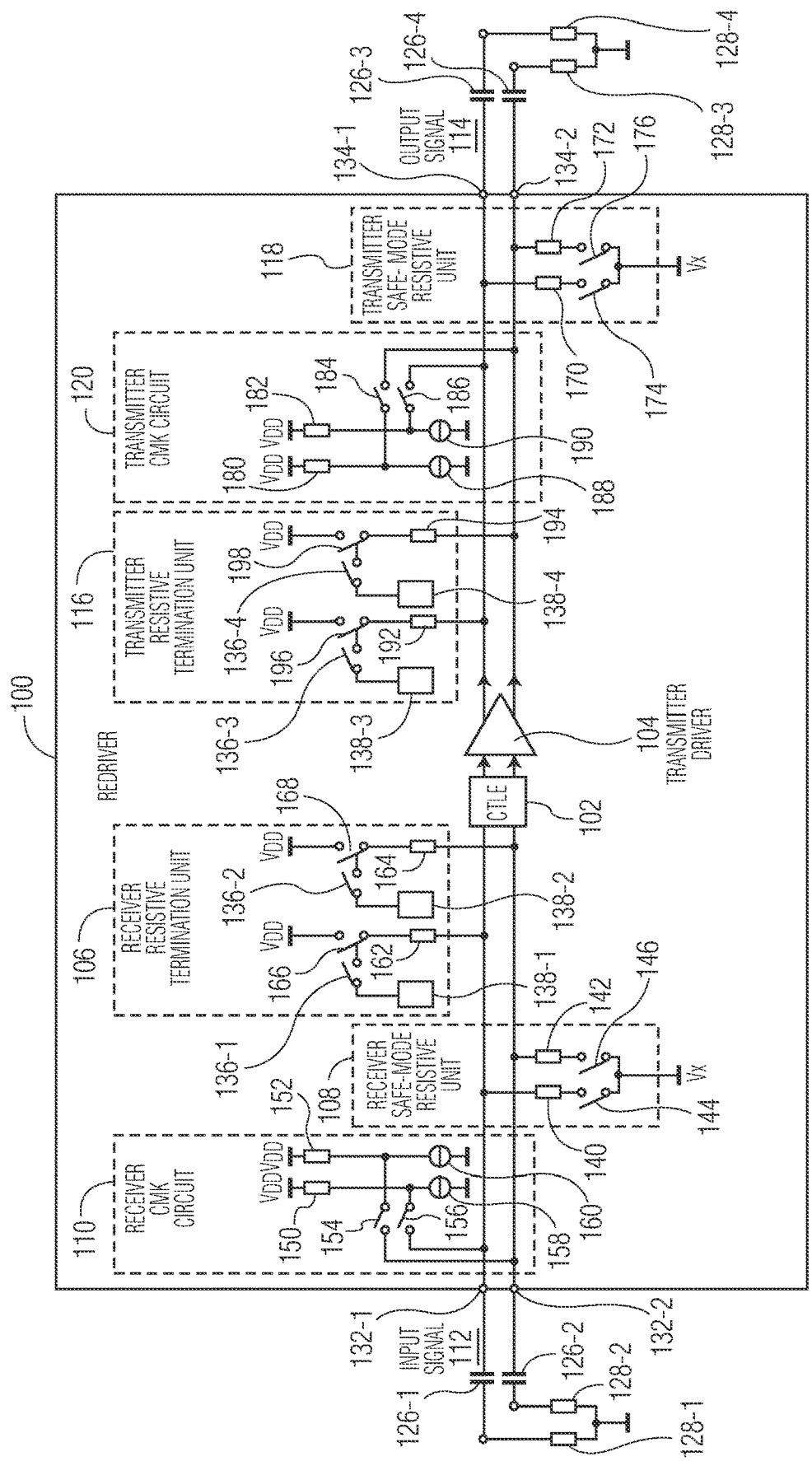
FIG. 1 is a schematic block diagram of a redriver in accordance with an embodiment of the invention.

FIG. 1 is a schematic block diagram of a redriver 100 in accordance with an embodiment of the invention. The redriver can be used to provide signal amplification and/or waveform shaping such that a transmitted signal behaves as intended over long channels. For example, the redriver can be used to reduce insertion loss and/or to address other signal integrity challenge. In the embodiment depicted in FIG. 1, the redriver generates a desired output signal 114 in response to an input signal 112. The redriver can be used in various applications, such as automotive applications, communications applications, industrial applications, medical applications, computer applications, and/or consumer or appliance applications. For example, the redriver can be used in Universal Serial Bus (USB), Thunderbolt (TBT), DisplayPort (DP), and/or CIO applications. In the embodiment depicted in FIG. 1, the redriver includes a Continuous Time Linear Equalizer (CTLE) 102, a transmitter driver 104, a receiver resistive termination unit 106, a receiver safe-mode resistive unit 108, a receiver Common Mode Keeper (CMK) circuit 110, a transmitter resistive termination unit 116, a transmitter safe-mode resistive unit 118, and a transmitter CMK circuit 120. In some embodiments, the redriver is a linear redriver that processes the incoming waveform in linear operations to generate an outgoing waveform. In other embodiments, the redriver is a limiting (non-linear) redriver that an outgoing waveform is produced by non-linear operations from the incoming waveform. In the embodiment depicted in FIG. 1, the redriver is electrically connected to decoupling capacitors 126-1, 126-2, 126-3, 126-4 and resistors 128-1, 128-2, 128-3, 128-4, which are connected to a reference voltage such as ground. In some embodiments, at least one of the decoupling capacitors 126-1, 126-2, 126-3, 126-4 has a capacitance value that is in the range of one to a few 100 nF and at least one of the resistors 128-1, 128-2, 128-3, 128-4 has a resistance value that is in the range of 200K ohms ($\Omega$). In some embodiments, the redriver is implemented in a substrate and is packaged as a stand-alone semiconductor IC device or chip. In these embodiments, the decoupling capacitors and the resistors are external to the redriver. In some embodiments, the redriver is included in a computing device, such as a smartphone, a tablet computer, a laptop, etc. In some embodiments, at least some of the components of the redriver are implemented in a substrate, such as a semiconductor wafer or a printed circuit board (PCB). In an embodiment, at least some of the components of the redriver are packaged as a stand-alone semiconductor IC chip. In the embodiment depicted in FIG. 1, the redriver 100 can support multiple operational modes. Examples of the operational modes supported by the redriver include, without being limited to, a power saving operational mode, a safe state operational mode, a USB operational mode, a DP operational mode, a TBT operational mode, a CIO operational mode, and a far-end termination detect operational mode. Although the redriver is shown in FIG. 1 as including certain circuit elements, in other embodiments, the redriver may include one or more additional circuit elements. For example, the redriver may include more than two CMK circuits or less than two CMK circuits in other embodiments. In another example, the redriver may include the decoupling capacitors in other embodiments.

Supply voltage ramp-up or supply voltage ramp-down of the redriver 100 may cause an abrupt voltage change at one or more input terminals 132-1, 132-2 and/or output terminals 134-1, 134-2 of the redriver. For example, switching from no supply voltage (zero volt) to maximum supply voltage ($V_{DD}$) or from maximum supply voltage ($V_{DD}$) to no supply voltage (zero volt) may cause an abrupt voltage change at one or more input terminals 132-1, 132-2 and/or output terminals 134-1, 134-2 of the redriver 100. Specifically, an input/output terminal 132-1, 132-2, 134-1, or 134-2 of the redriver is electrically connected to a corresponding decoupling capacitor 126-1, 126-2, 126-3, or 126-4 with a large capacitance value, which can isolate the DC level of the redriver input/output from an IC chip electrically connected to the redriver that is situated before or after the redriver in the signal path. For example, the redriver can be connected to a chip with more advanced technology or lower absolute maximum voltage value. Because the capacitance values of the decoupling capacitors 126-1, 126-2, 126-3, 126-4 are typically large (e.g., in the range of 100 nF or more), an abrupt voltage change at a specific input/output terminal of the redriver can damage an electronic device, such as, an IC chip that is situated before or after the redriver in the signal path if the absolute maximum voltage of the electronic device is lower than the voltage present at the specific input/output terminal as a result of the abrupt voltage change. In the embodiment depicted in FIG. 1, the redriver 100 can provide a safe and robust solution to control abrupt voltage change or voltage jump at input terminals 132-1, 132-2 and/or output terminals 134-1, 134-2 of the redriver during a supply voltage ramp-up or a supply voltage ramp-down, as described in detailed below.

In the embodiment depicted in FIG. 1, the CTLE 102 is configured to perform signal equalization on the input signal 112. The CTLE can be implemented using known architectures. In some embodiments, the CTLE is used with an input buffer before it and multiple amplifiers with different gains. For example, the CTLE may include an amplifier with a low frequency gain and an amplifier with a peaking gain to shape the required alternating current (AC) response or equalization.

In the embodiment depicted in FIG. 1, the transmitter driver 104 is configured to generate a driver signal in response to the signal equalization performed by the CTLE 102. The transmitter driver may be implemented by one or more PNP bipolar transistors, one or more P-channel metal-oxide-semiconductor field-effect transistor (MOSFET) (PMOS) transistors, one or more NPN bipolar transistors, and/or one or more N-channel metal-oxide-semiconductor field-effect transistor (MOSFET) (NMOS) transistors. In implementations in which the transmitter driver is implemented using an NPN transistor or an NMOS transistor, 50-ohm termination resistors may be terminated into the DC supply voltage, $V_{DD}$, of the redriver 100 instead of terminated into a reference voltage such as ground.

In the redriver 100 depicted in FIG. 1, each of the receiver safe-mode resistive unit 108 and the transmitter safe-mode resistive unit 118 are terminated to a DC termination voltage, $V_X$, which may be close to half of the DC supply voltage, $V_{DD}$, of the redriver 100 instead of ground. For example, the DC termination voltage may be around 1.2 volt (e.g., within +30% of 1.2 volt) and the DC supply voltage, $V_{DD}$, of the redriver may be around 1.8 volt (e.g., within +10% of 1.8 volt). The DC termination voltage, $V_X$, can be generated by a voltage regulator or a voltage divider (e.g., with value of ~1.2V or middle rail or any value, which is close to the DC operation point of high-speed pins/terminals). In some embodiments, the DC termination voltage, $V_X$, is maintained around operational common mode voltages of RX and TX nodes/pins 132-1, 132-2, 134-1, 134-2. When the receiver safe-mode resistive unit and the transmitter safe-mode resistive unit are terminated to ground, a voltage change of around 1.8 volt (i.e., zero volt to around 1.8 volt, the DC supply voltage, $V_{DD}$, of the redriver), is presented at an input/output terminal 132-1, 132-2, 134-1, or 134-2 of the redriver, during a switch between different operational modes in the redriver if the common mode for certain operation modes are close to $V_{DD}$. However, when the receiver safe-mode resistive unit and the transmitter safe-mode resistive unit are terminated to the DC termination voltage, a voltage change of 0.6 volt (i.e., 1.2 volt to 1.8 volt, the DC supply voltage, $V_{DD}$, of the redriver), is presented at an input/output terminal of the redriver, during a switch between different operational modes in the redriver. Consequently, the magnitude of a voltage change at input/output terminals of the redriver caused by switching between different operational modes in the redriver is reduced. In some implementations, the receiver CMK circuit 110 and the transmitter CMK circuit 120 are kept on in order to reduce voltage swing at an input/output terminal of the redriver during a switch between different operational modes. However, the current consumption of the receiver CMK circuit and the transmitter CMK circuit can be high. For example, for a 4-channel redriver, a current of around 80-200 microampere ($\mu A$) can be consumed, which is higher than the current threshold for a power saving mode. Compared to a redriver implementation in which the receiver CMK circuit and the transmitter CMK circuit are kept on, terminating the receiver safe-mode resistive unit and the transmitter safe-mode resistive unit to the DC termination voltage, $V_X$, which is close to half of the DC supply voltage, $V_{DD}$, of the redriver can limit a spike of the current consumption. For example, terminating the receiver safe-mode resistive unit and the transmitter safe-mode resistive unit to the DC termination voltage, $V_X$, may result in 1 μA current increase in any operational mode of the redriver. Consequently, the redriver in the embodiment depicted in FIG. 1 can be used in a power saving mode.

In the embodiment depicted in FIG. 1, the receiver safe-mode resistive unit 108 is electrically connected to the CTLE 102 and to the input terminals 132-1, 132-2 of the redriver 100. In some embodiments, the receiver safe-mode resistive unit is used to show a minimum impedance when the redriver is turned off. The receiver safe-mode resistive unit includes two resistors 140, 142 electrically connected to the input terminals 132-1, 132-2 of the redriver, two switches 144, 146 serially connected to the resistors 140, 142, and the DC termination voltage, $V_X$. In some embodiments, to be compatible with USB standards, the receiver safe-mode resistive unit is not terminated to the DC supply voltage, $V_{DD}$, of the redriver. In some embodiments, the termination voltage is lower than the DC supply voltage, $V_{DD}$, of the redriver and is higher than a DC reference voltage such as the ground. The resistance value of the resistors 140, 142 may be more than 25 kΩ, for example 200 kΩ (e.g., within ±30% of 200 kΩ). In some embodiments, the receiver safe-mode resistive unit includes one or more processors, such as digital state machines, microcontrollers or central processing units (CPUs) configured to control the switches.

In the embodiment depicted in FIG. 1, the receiver CMK circuit 110 includes two resistors 150, 152, two switches 154, 156, and two current sources 158, 160. The resistance value of the resistors 150, 152 may be around of 20K ohms (e.g., within ±30% of 20 kΩ). In some embodiments, the receiver CMK circuit includes one or more processors, such as digital state machines, microcontrollers or CPUs configured to control the switches.

In the embodiment depicted in FIG. 1, the receiver resistive termination unit 106 is electrically connected to the CTLE 102 and to the input terminals 132-1, 132-2 of the redriver 100. The receiver resistive termination unit includes two resistors 162, 164 electrically connected to the input terminals 132-1, 132-2 of the redriver, two switches 166, 168 serially connected to the resistors respectively and to the direct current (DC) supply voltage, $V_{DD}$, of the redriver or a DC reference voltage between ground and the supply voltage, two switches 136-1, 136-2 connected to the switches 166, 168, respectively, and configured to be turned on or off in response to a change in the supply voltage, $V_{DD}$, of the redriver (e.g., a ramp up event in which the supply voltage of the redriver increases from zero volt to a predefined voltage threshold, $V_{DD}$, or a ramp down event in which in which the supply voltage of the redriver decreases from a predefined voltage threshold, $V_{DD}$, to zero volt), and control circuits 138-1, 138-2 connected to the switches 166, 168 through the switches 136-1, 136-2 (e.g., control signals from the control circuits 138-1, 138-2 going through the switches 136-1, 136-2 to reach the switches 166, 168) and configured to generate control signals for the switches 166, 168. For example, when the switches 136-1, 136-2 are turned on (i.e., conductive), control signals from the control circuits 138-1, 138-2 can reach the switches 166, 168, and when the switches 136-1, 136-2 are turned off (i.e., non-conductive), control signals from the control circuits 138-1, 138-2 cannot reach the switches 166, 168. By turning on or off the switches 136-1, 136-2 connected to the switches 166, 168 in response to a ramp up or a ramp down of the supply voltage, $V_{DD}$, of the redriver, the control circuits 138-1, 138-2 can selectively apply control signals to the switches 166, 168 in response to a ramp up or a ramp down of the supply voltage, $V_{DD}$, of the redriver. Consequently, the leakage current in the switches 166, 168 can be reduced, and as a result, the abrupt voltage change or voltage jump at input terminals 132-1, 132-2 of the redriver during supply voltage ramp-up or ramp-down can be reduced. In some embodiments, the control circuits 138-1, 138-2 are connected to the bodies of the switches 166, 168 and configured to generate control signal for body terminals or pins of the switches 166, 168. The resistance value of the resistors 162, 164 may be around of 50 ohms (e.g., within ±30% of 50Ω). The control circuits 138-1, 138-2 may include one or more processors, such as digital state machines, microcontrollers or CPUs configured to control the switches 166, 168. In some embodiments, the receiver resistive termination unit includes one or more control circuits configured to generate control signals for turning on or off the switches 136-1, 136-2 in response to a change in the supply voltage, $V_{DD}$, of the redriver (e.g., a ramp up event in which the supply voltage of the redriver increases from zero volt to a predefined voltage threshold, $V_{DD}$, or a ramp down event in which the supply voltage of the redriver decreases from a predefined voltage threshold, $V_{DD}$, to zero volt).

In the embodiment depicted in FIG. 1, the transmitter safe-mode resistive unit 118 is electrically connected to the transmitter driver 104 and to the output terminals 134-1, 134-2 of the redriver 100. In some embodiments, the transmitter safe-mode resistive unit is used to show a minimum impedance when the redriver is turned off. The transmitter safe-mode resistive unit includes two resistors 170, 172 electrically connected to the output terminals 134-1, 134-2 of the redriver, two switches 174, 176 serially connected to the resistors 170, 172, and the DC termination voltage, $V_X$. In some embodiments, to be compatible with USB standards, the receiver safe-mode resistive unit is not terminated to the DC supply voltage, $V_{DD}$, of the redriver. In some embodiments, the termination voltage, $V_X$, is lower than the DC supply voltage, $V_{DD}$, of the redriver and is higher than a DC reference voltage such as the ground. The resistance value of the resistors 170, 172 may be around of 25 kΩ to 200 kΩ (e.g., within ±30% of 200 kΩ). In some embodiments, the transmitter safe-mode resistive unit includes one or more processors, such as digital state machines, microcontrollers or CPUs configured to control the switches.

In the embodiment depicted in FIG. 1, the transmitter CMK circuit 120 includes two resistors 180, 182, two switches 184, 186, and two current sources 188, 190. The resistance value of the resistors 180, 182 may be around (e.g., within ±30%) of 25 kΩ. In some embodiments, the transmitter CMK circuit includes one or more processors, such as digital state machines, microcontrollers or CPUs configured to control the switches.

In the embodiment depicted in FIG. 1, the transmitter resistive termination unit 116 is electrically connected to the transmitter driver 104 and to the output terminals 134-1, 134-2 of the redriver 100. The transmitter resistive termination unit includes two resistors 192, 194 electrically connected to the output terminals 134-1, 134-2 of the redriver and two switches 196, 198 serially connected to the resistors 192, 194 respectively and to the DC supply voltage, $V_{DD}$, of the redriver, two switches 136-3, 136-4 connected to the switches 196, 198, respectively, and configured to be turned on or off in response to a change in the supply voltage, $V_{DD}$, of the redriver (e.g., a ramp up event in which the supply voltage of the redriver increases from zero volt to a predefined voltage threshold, $V_{DD}$, or a ramp down event in which in which the supply voltage of the redriver decreases from a predefined voltage threshold, $V_{DD}$, to zero volt), and control circuits 138-3, 138-4 connected to the switches 196, 198 through the switches 136-3, 136-4 and configured to generate control signals for the switches 196, 198. By turning on or off the switches 136-3, 136-4 connected to the switches 196, 198 in response to a ramp up or a ramp down of the supply voltage, $V_{DD}$, of the redriver, the control circuits 138-3, 138-4 can selectively apply control signals to the switches 196, 198 in response to a ramp up or a ramp down of the supply voltage, $V_{DD}$, of the redriver. Consequently, the leakage current in the switches 196, 198 can be reduced, and as a result, the abrupt voltage change or voltage jump at output terminals 134-1, 134-2 of the redriver during a supply voltage ramp-up or ramp-down can be reduced. In some embodiments, the control circuits 138-3, 138-4 are connected to the bodies of the switches 196, 198 and configured to generate control signal for body terminals or pins of the switches 196, 198. The resistance value of the resistors 192, 194 may be around of 50Ω (e.g., within ±30% of 50Ω). In some embodiments, the transmitter resistive termination unit includes one or more processors, such as digital state machines, microcontrollers or CPUs configured to control the switches. In some embodiments, the transmitter resistive termination unit includes one or more control circuits configured to generate control signals for turning on or off the switches 136-3, 136-3 in response to a change in the supply voltage, $V_{DD}$, of the redriver (e.g., a ramp up event in which the supply voltage of the redriver increases from zero volt to a predefined voltage threshold, $V_{DD}$, or a ramp down event in which in which the supply voltage of the redriver decreases from a predefined voltage threshold, $V_{DD}$, to zero volt).

Figure 2:
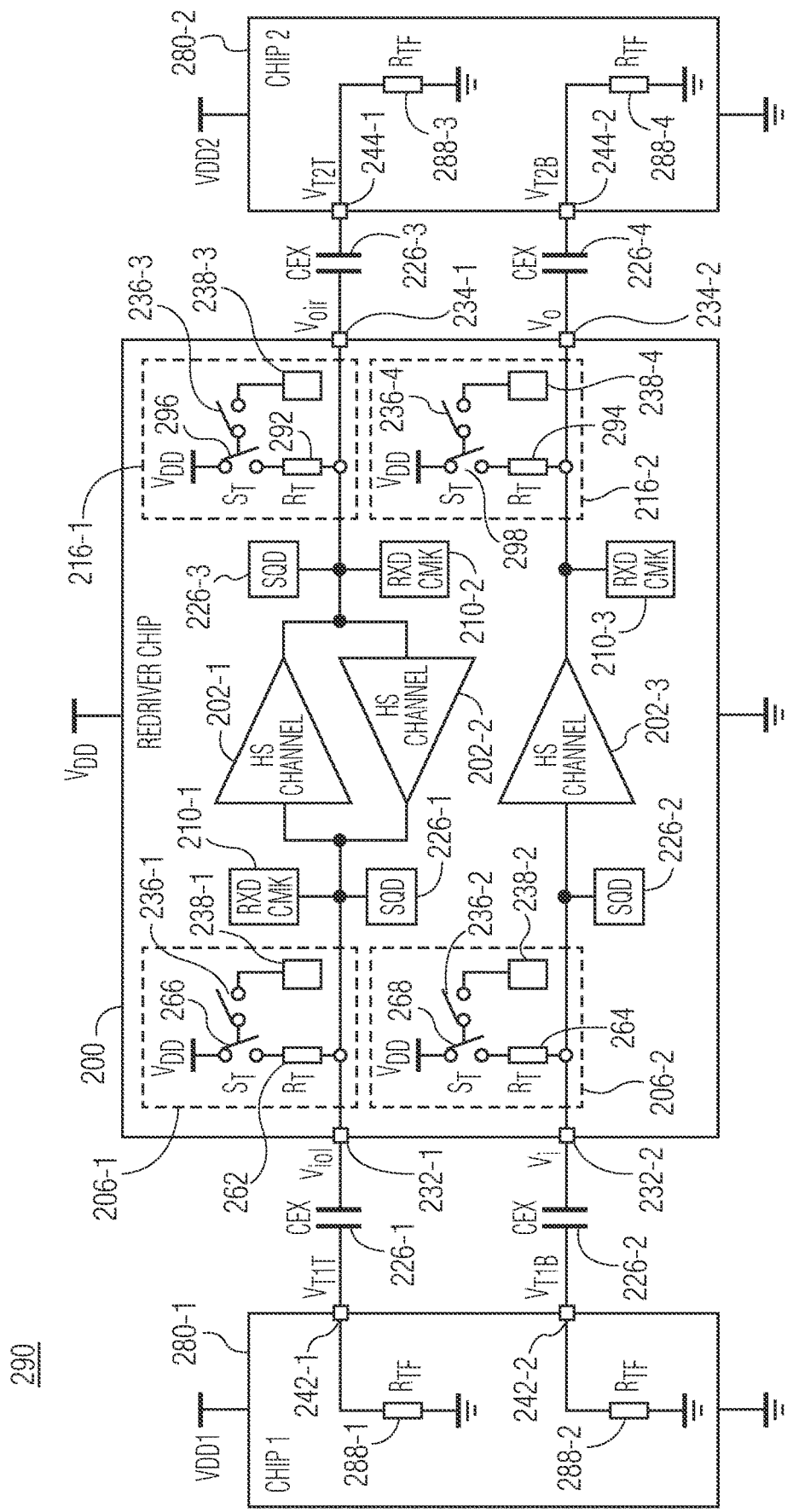
FIG. 2 depicts a redriver that is connected to multiple IC chips.

FIG. 2 depicts a redriver 200 (e.g., a redriver IC chip) that is connected to IC chips 280-1, 280-2. In the embodiment depicted in FIG. 2, the redriver 200 is connected to a first IC chip 280-1 through input terminals/pins 232-1, 232-2 and is connected to a second IC chip 280-2 through output terminals/pins 234-1, 234-2. The redriver can be used to provide signal amplification and/or waveform shaping such that a transmitted signal behaves as intended over long channels. For example, the redriver can be used to reduce insertion loss and/or to address other signal integrity challenge. In the embodiment depicted in FIG. 2, the first IC chip 280-1, the second IC chip 280-2, and redriver 200 can form a combination redriver system 290 with bi-directional and uni-directional high-speed repeating functionality. Supply voltages, $V_{DD1}$ and $V_{DD2}$, of the IC chips 280-1, 280-2 may be the same or different from supply voltage, $V_{DD}$, of the redriver 200. The IC chips 280-1, 280-2 may exist on the same substrate or different substrates from the redriver 200. Connections between the redriver and the IC chips 280-1, 280-2 may be through printed circuit board (PCB) pins and/or cable connectors. In the embodiment depicted in FIG. 2, the redriver 200 includes two receiver resistive termination units 206-1, 206-2, three RX detect (RXD) (e.g., far end termination detector) Common Mode Keeper (CMK) circuits 210-1, 210-2, 210-3, two transmitter resistive termination units 216-1, 216-2, three high-speed (HS) channels 202-1, 202-2, 202-3, and three signal detectors (SQD) 226-1, 226-2, 226-3 (e.g., loss of signal (LoS) detectors and/or Low Frequency Periodic Signaling (LFPS) detectors). Each of the high-speed channels 202-1, 202-2, 202-3 may include a Continuous Time Linear Equalizer (CTLE), a transmitter driver, a receiver resistive termination unit, a receiver safe-mode resistive unit, a receiver Common Mode Keeper (CMK) circuit, a transmitter resistive termination unit, a transmitter safe-mode resistive unit, and/or a transmitter CMK circuit, which can be similar to or the same as the CTLE 102, the transmitter driver 104, the receiver resistive termination unit 106, the receiver safe-mode resistive unit 108, the receiver CMK circuit 110, the transmitter resistive termination unit 116, the transmitter safe-mode resistive unit 118, and/or the transmitter CMK circuit 120 of the redriver 100 depicted in FIG. 1, respectively. Although the redriver 200 is depicted in FIG. 2 as a single-ended redriver, in other implementations, the redriver 200 is implemented as a fully differential redriver.

In the embodiment depicted in FIG. 2, the receiver resistive termination units 206-1, 206-2 are electrically connected to the input terminals 232-1, 232-2 of the redriver 200. Each of the receiver resistive termination units 206-1, 206-2 includes a resistor 262 or 264 electrically connected to an input terminal 232-1 or 232-2 of the redriver, a switch 266 or 268 connected to the resistor and to the direct current (DC) supply voltage, $V_{DD}$, of the redriver, a switch 236-1 or 236-2 connected to the switch 266 or 268 and configured to be turned on or off in response to a change in the supply voltage, $V_{DD}$, of the redriver (e.g., a ramp up event in which the supply voltage of the redriver increases from zero volt to a predefined voltage threshold, $V_{DD}$, or a ramp down event in which in which the supply voltage of the redriver decreases from a predefined voltage threshold, $V_{DD}$, to zero volt), and a control circuit 238-1 or 238-2 connected to the switch 266 or 268 through the switch 236-1 or 236-2 and configured to generate control signals for the switch 266 or 268 (e.g., control signals from the control circuits 238-1, 238-2 going through the switches 236-1, 236-2 to reach the switches 266, 268). For example, when the switches 236-1, 236-2 are turned on (i.e., conductive), control signals from the control circuits 238-1, 238-2 can reach the switches 266, 268, and when the switches 236-1, 236-2 are turned off (i.e., non-conductive), control signals from the control circuits 238-1, 238-2 cannot reach the switches 266, 268. In some embodiments, the control circuits 238-1, 238-2 are connected to the bodies of the switches 266, 268 and configured to generate control signal for body terminals or pins of the switches 266, 268. The resistance value of the resistors 262, 264 may be around of 50Ω (e.g., within ±30% of 50Ω). The control circuits 238-1, 238-2 may include one or more processors, such as digital state machines, microcontrollers or CPUs configured to control the switches 266, 268. In some embodiments, the receiver resistive termination unit includes one or more control circuits configured to generate control signals for turning on or off the switches 236-1, 236-2 in response to a change in the supply voltage, $V_{DD}$, of the redriver (e.g., a ramp up event in which the supply voltage of the redriver increases from zero volt to a predefined voltage threshold, $V_{DD}$, or a ramp down event in which in which the supply voltage of the redriver decreases from a predefined voltage threshold, $V_{DD}$, to zero volt).

In the embodiment depicted in FIG. 2, the transmitter resistive termination units 216-1, 216-2 are electrically connected to the output terminals 234-1, 234-2 of the redriver 200. Each of the transmitter resistive termination units 216-1, 216-2 includes a resistor 292 or 294 electrically connected to an output terminal 234-1 or 234-2 of the redriver, a switch 296 or 298 connected to the resistor and to the direct current (DC) supply voltage, $V_{DD}$, of the redriver, a switch 236-3 or 236-4 connected to the switch 296 or 298 and configured to be turned on or off in response to a change in the supply voltage, $V_{DD}$, of the redriver (e.g., a ramp up event in which the supply voltage of the redriver increases from zero volt to a predefined voltage threshold, $V_{DD}$, or a ramp down event in which in which the supply voltage of the redriver decreases from a predefined voltage threshold, $V_{DD}$, to zero volt), and a control circuit 238-3 or 238-4 connected to the switch 296 or 298 through the switch 236-3 or 236-4 and configured to generate control signals for the switch 296 or 298 (e.g., control signals from the control circuits 238-3, 238-4 going through the switches 236-3, 236-4 to reach the switches 296, 298). For example, when the switches 236-3, 236-4 are turned on (i.e., conductive), control signals from the control circuits 238-3, 238-4 can reach the switches 296, 298, and when the switches 236-3, 236-4 are turned off (i.e., non-conductive), control signals from the control circuits 238-3, 238-4 cannot reach the switches 296, 298. In some embodiments, the control circuits 238-3, 238-4 are connected to the bodies of the switches 296, 298 and configured to generate control signal for body terminals or pins of the switches 296, 298. The resistance value of the resistors 292, 294 may be around of 50 ohms (e.g., within ±30% of 50 ohms). The control circuits 238-3, 238-4 may include one or more processors, such as digital state machines, microcontrollers or CPUs configured to control the switches 296, 298. In some embodiments, the receiver resistive termination unit includes one or more control circuits configured to generate control signals for turning on or off the switches 236-3, 236-4 in response to a change in the supply voltage, $V_{DD}$, of the redriver (e.g., a ramp up event in which the supply voltage of the redriver increases from zero volt to a predefined voltage threshold, $V_{DD}$, or a ramp down event in which in which the supply voltage of the redriver decreases from a predefined voltage threshold, $V_{DD}$, to zero volt).

In the embodiment depicted in FIG. 2, the redriver 200 is electrically connected to the IC chips 280-1, 280-2 via decoupling capacitors 226-1, 226-2, 226-3, 226-4 with a capacitance value, $C_{EX}$, which may be around 100 nF to 300 nF to isolate DC values of the redriver chip 200 from the IC chips 280-1, 280-2. During a ramp up or ramp down of the supply voltage of the redriver 200 (e.g., from 0 to $V_{DD}$ or from $V_{DD}$ to 0), its delta(V) (i.e., the change) of voltages Viol, Vi and Voir, Vo at the input terminals/pins 232-1, 232-2 and the output terminals/pins 234-1, 234-2 can be large. Due to the large capacitance value of the capacitors 226-1, 226-2, 226-3, 226-4, the complete deltaV can be passed to the other chips (e.g., to the IC chips 280-1, 280-2 via terminals or pins 242-1, 242-2 having voltages $V_{T1T}$, $V_{T1B}$ and terminals or pins 244-1, 244-2 having voltages $V_{T2T}$, $V_{T2B}$), and potentially damage other chips (e.g., the IC chips 280-1, 280-2). For example, the redriver 200 may be in 1.8V or 3.3V voltage domain and the IC chips 280-1, 280-2 may be in 1V voltage domain. The large deltaV from the redriver 200 seen by the IC chips 280-1, 280-2 can exceed the maximum operating voltage of the IC chips 280-1, 280-2 and damage the IC chips 280-1, 280-2. A related patent, U.S. Pat. No. 10,812,067 addresses "functional" mode change of a redriver by keeping functional DC voltage around middle of the rail ($V_{DD}/2$), which can make the maximum deltaV half of the deltaV value without the offered solution. However, in case of a ramp up or ramp down of the supply voltage of the redriver 200, deltaV (i.e., the change) of voltages $V_{IOL}$, $V_I$, $V_{OIR}$, $V_O$ at the input terminals/pins 232-1, 232-2 and the output terminals/pins 234-1, 234-2 can exceed desired values. In the redriver 200, input and output termination of resistors 262, 264, 292, 294 have a resistance value, $R_T$, (e.g., 50Ω), which can be operational by enabling/disabling switches (ST) 266, 268, 296, 298. In the IC chips 280-1, 280-2, far-end termination resistors 288-1, 288-2, 288-3, 288-4 have a resistance value, $R_{TF}$, which can be either equal to the resistance value, $R_T$, of the resistors 262, 264, 292, 294 or of a larger resistance value, e.g., 50-200 kΩ. When the resistors 262, 264, 292, 294 are not connected a positive voltage, $V_{DD}$, through the switches 266, 268, 296, 298, in case of ramp up or ramp down of the supply voltage, $V_{DD}$, deltaV of voltages $V_{IOL}$, $V_I$, $V_{OIR}$, $V_O$ at the input terminals/pins 232-1, 232-2 and the output terminals/pins 234-1, 234-2 can exceed desired values. Specifically, when gate control circuits for the switches 266, 268, 296, 298 have no clear correlation with ramp down or ramp up of the supply voltage, $V_{DD}$, the switches 266, 268, 296, 298 can be enabled or disabled at a non-desired time, which can cause a large deltaV that can be passed to the IC chips 280-1, 280-2.

In the embodiment depicted in FIG. 2, by turning on or off the switches 236-1, 236-2 connected to the switches 266, 268 in response to a ramp up or a ramp down of the supply voltage, $V_{DD}$, of the redriver, the control circuits 238-1, 238-2 can selectively apply control signals to the switches 266, 268 in response to a ramp up or a ramp down of the supply voltage, $V_{DD}$, of the redriver. Consequently, the leakage current in the switches 266, 268 can be reduced, and as a result, the abrupt voltage change or voltage jump at input terminals 232-1, 232-2 of the redriver during a supply voltage ramp-up or ramp-down can be reduced. In addition, by turning on or off the switches 236-3, 236-4 connected to the switches 296, 298 in response to a ramp up or a ramp down of the supply voltage, $V_{DD}$, of the redriver, the control circuits 238-3, 238-4 can selectively apply control signals to the switches 296, 298 in response to a ramp up or a ramp down of the supply voltage, $V_{DD}$, of the redriver. Consequently, the leakage current in the switches 296, 298 can be reduced, and as a result, the abrupt voltage change or voltage jump at output terminals 234-1, 234-2 of the redriver during a supply voltage ramp-up or ramp-down can be reduced. For example, the switches 266, 268, 296, 298 may be implemented as transistors and the control circuits 238-1, 238-2, 238-3, 238-4 may control body and gate of the switches 266, 268, 296, 298. The control circuits 238-1, 238-2, 238-3, 238-4 may be designed to meet a USB3 compliance requirement. In some embodiments, the control circuits 238-1, 238-2, 238-3, 238-4 may use indicator of supply availability/non-availability to control the switches 266, 268, 296, 298 to reduce abrupt voltage change at the input terminals/pins 232-1, 232-2 and the output terminals/pins 234-1, 234-2 of the redriver 200. USB standards limit the allowed positive and negative Common Mode (CM) changes during ramp up or down of the supply voltage, $V_{DD}$, and any mode transitions, which translates to limited abrupt voltage changes or CM changes for voltages $V_{T1T}$, $V_{T1B}$ at the terminals or pins 242-1, 242-2 and voltages $V_{T2T}$, $V_{T2B}$ at the terminals or pins 244-1, 244-2 after the decoupling capacitors 226-1, 226-2, 226-3, 226-4.

FIG. 3 depicts a simplified voltage jump model 300 of the redriver 200 depicted in FIG. 2. In the voltage jump model 300 of FIG. 3, a far-end termination resistor 388 has a resistance value, $R_{TF}$, which can be either 50Ω or 200 kΩ according to a USB standard. For example, 200 kΩ of the resistance value, $R_{TF}$, can be a challenging far-end termination value to minimize the voltage jump or abrupt voltage change due to its high value. A decoupling capacitor 326 has a capacitance value, $C_{EX}$. $V_{CM}$ represents an internal voltage that can cause abrupt voltage change on a high-speed pin/terminal of the redriver 200. A resistor 366 has a resistance value, $R_{CHIP}$, and is the equivalent resistance of the redriver in an abrupt voltage change event, which is around 502 when the redriver termination is turned on but has a much higher value when the redriver termination is turned off. To minimize abrupt voltage change, either the jump from $V_{CM}$ is minimized or the resistance value, $R_{CHIP}$, is maximized to exploit the voltage division between the resistor 366 and the resistor 388. When powering up/down the redriver 200, voltages $V_{IOL}$, $V_I$, $V_{OIR}$, $V_O$ at high-speed terminals/pins 232-1, 232-2, 234-1, 234-2 start to settle to targeted CM voltages set by either CMK circuits or safe mode resistors. The targeted CM values are optimized considering the CM differences of all modes. Typically, the target values is slightly higher than $0.5V_{DD}$. Circuits connected to the pins are optimized to have high impedance during these events. As a result, divided outputs are seen at the connect sides.

FIG. 4 depicts some examples of redriver side and connector side voltages of the redriver 200 under the simplified voltage jump model 300 depicted in FIG. 3. As shown in FIG. 4, a high-speed terminal/pin of the redriver 200 have its CM voltage settled to about 1.2V, which can cause a CM shift to the connector side. However, the abrupt voltage change at the connect side (after the decoupling capacitor 326 with the capacitance value, $C_{EX}$) is within −0.5V and 1V when the resistance value, $R_{chip}$, 366 has a resistance value close or greater than 200 kΩ. Once the redriver 200 is powered up, a challenging abrupt voltage change happens when a high speed channel of the redriver 200 is turned on and off with a 200 kΩ far-end termination. During these transitions, 50Ω termination of the redriver can be turn on and off relatively faster than the bias current. Thus, pin voltages can jump to as high as the supply voltage, $V_{DD}$, from the initial CM voltages set by either CMK circuits or safe mode resistors. Higher initial CM values can minimize these channel on/off abrupt voltage changes but can increase the abrupt voltage changes during the power up/down events. The CM voltages from CMK circuits and safe mode resistors can be set to be slightly higher than $0.5V_{DD}$. Because the redriver termination has much lower impedance compared to 200 kΩ, voltage division effect is limited. FIG. 5 depicts some examples of redriver side and connector side voltages of the redriver 200 under the simplified voltage jump model 300 depicted in FIG. 3 in case of a ramp up or ramp down of the supply voltage, $V_{DD}$. As demonstrated in FIG. 5, the abrupt voltage change is limited to 0.6V with a 1.2V initial $V_{CM}$ and a $V_{DD}$ of 1.8V.

Figure 6:
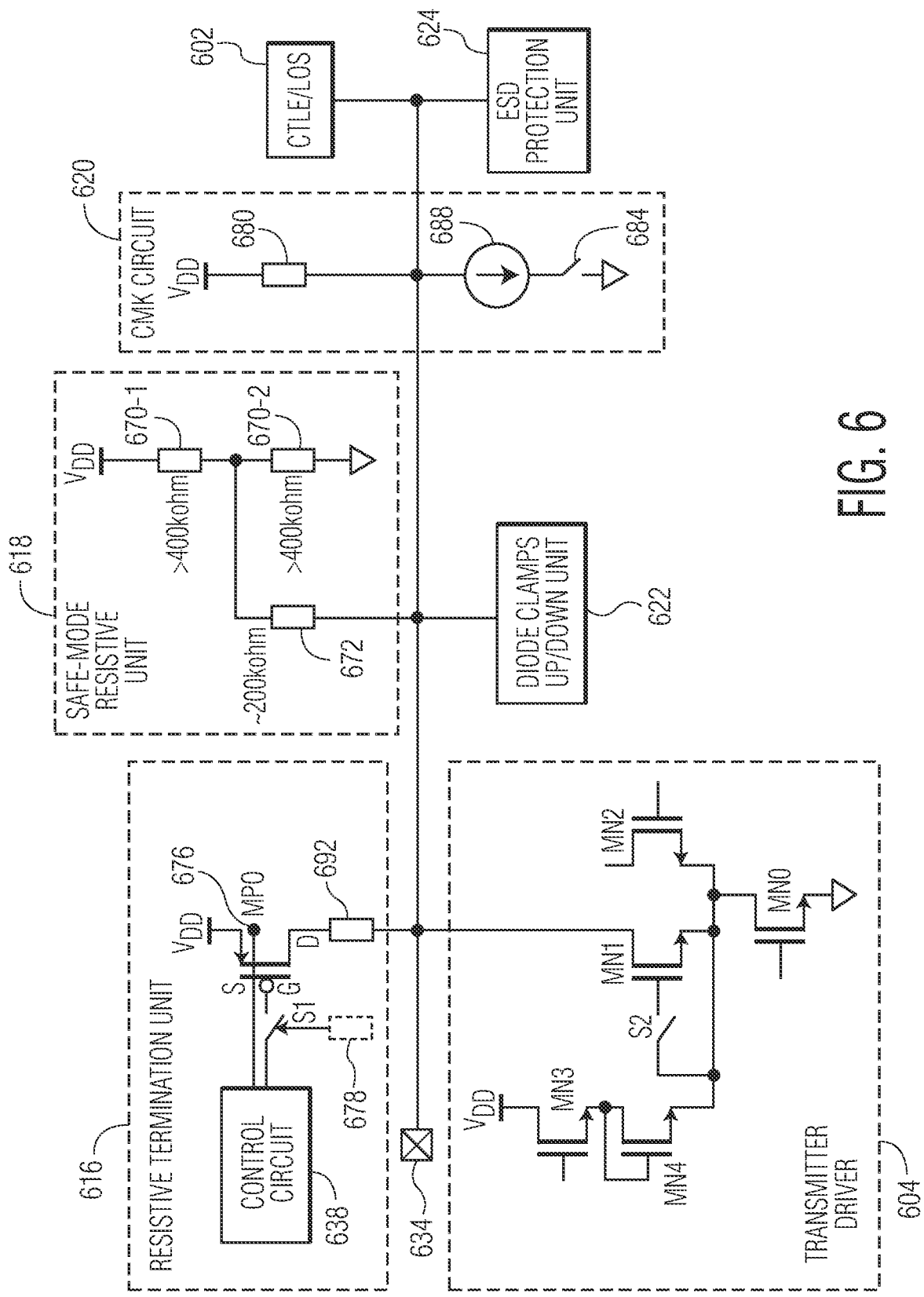
FIG. 6 depicts a resistive termination unit, a transmitter driver, a safe-mode resistive unit, a CMK circuit, a Continuous Time Linear Equalizer (CTLE) or LOS (Loss of Signal Detection circuit), a diode or clamp up/down unit, and an electrostatic discharge (ESD) protection unit that are connected to an input/output terminal/pin of a redriver.

FIG. 6 depicts a resistive termination unit 616, a transmitter driver 604, a safe-mode resistive unit 618, a CMK circuit 620, a Continuous Time Linear Equalizer (CTLE) or LOS 602, a diode or clamp up/down unit 622, and an electrostatic discharge (ESD) protection unit 624 that are connected to an input/output terminal/pin 634 of a redriver (e.g., the redriver 100 depicted in FIG. 1 or the redriver 200 depicted in FIG. 2). The resistive termination unit 616 and the transmitter driver 604 depicted in FIG. 6 are in single-ended form. However, the resistive termination unit 616 and the transmitter driver 604 depicted in FIG. 6 can be implemented in fully differential form. In the embodiment depicted in FIG. 6, the resistive termination unit 616 is electrically connected to the transmitter driver 604 and to the input/output terminal/pin 634 of the redriver. The resistive termination unit 616 includes a resistor 692 electrically connected to the input/output terminal/pin 634 of the redriver, a switch that is implemented as a PMOS transistor MP0, which is connected to the resistor 692 through the drain terminal (D) of the PMOS transistor MP0 to the DC supply voltage $V_{DD}$ of the redriver through the source terminal (S) of the PMOS transistor MP0, a switch S1 connected to the gate terminal (G) of the PMOS transistor MP0, and configured to be turned on or off in response to a change in the $V_{DD}$, supply voltage of the redriver (e.g., a ramp up event in which the supply voltage of the redriver increases from zero volt to a predefined voltage threshold $V_{DD}$, or a ramp down event in which in which the supply voltage of the redriver decreases from a predefined voltage threshold $V_{DD}$ to zero volt), and a control circuit 638 connected to the gate terminal (G) of the PMOS transistor MP0 through the switch S1 and connected to the body of the PMOS transistor MP0 and configured to generate control signals for the body terminal or pin 676 and the gate terminal (G) of the PMOS transistor MP0 (e.g., control signals from the control circuit 638 going through the switch S1 to reach the gate terminal (G) of the PMOS transistor MP0 and directly to the body terminal or pin 676 of the PMOS transistor MP0 without going through the switch S1 to control the body terminal or pin 676 of the PMOS transistor MP0). For example, when the switch S1 is turned on (i.e., conductive), control signals from the control circuit 638 can reach the gate terminal (G) of the PMOS transistor MP0, and when the switch S1 is turned off (i.e., non-conductive), control signals from the control circuit 638 cannot directly reach the gate terminal (G) of the PMOS transistor MP0. By turning on or off the switch S1 connected to the PMOS transistor MP0, in response to a ramp up or a ramp down of the supply voltage $V_{DD}$ of the redriver, the control circuit 638 can selectively apply control signals to the PMOS transistor MP0 in response to a ramp up or a ramp down of the supply voltage $V_{DD}$ of the redriver. Consequently, the leakage current in the PMOS transistor MP0 can be reduced, and as a result, the abrupt voltage change or voltage jump at the input/output terminal 634 of the redriver during supply voltage ramp-up or ramp-down can be reduced. The resistance value of the resistor 692 may be around of 50Ω (e.g., within ±30% of 50Ω). In some embodiments, the control circuit 638 includes one or more processors, such as digital state machines, microcontrollers or CPUs configured to generate a control signal for the PMOS transistor MP0. In some embodiments, the resistive termination unit 616 includes a control circuit 678 configured to generate a control signal for turning on or off the switch S1 in response to the change in the supply voltage $V_{DD}$ of the redriver. In the embodiment depicted in FIG. 6, the safe-mode resistive unit 618 includes resistors 670-1, 670-2, 672. In some embodiments, the safe-mode resistive unit 618 includes one or more switches. In the embodiment depicted in FIG. 6, the CMK circuit 620 includes a resistor 680, a current source 688, and a switch 684. In some embodiments, to minimize the abrupt voltage change during ramp up or ramp down of the supply voltage, $V_{DD}$, of the redriver, leakage for all components connected to the input/output terminal/pin 634 is reduced or minimized. Device sizes for the resistive termination unit 616, the transmitter driver 604, the safe-mode resistive unit 618, the CMK circuit 620, the CTLE or LOS 602, and the diode or clamp up/down unit 622 can be optimized or reduced to have minimal leakage. To meet the ramp up or ramp down voltage jump specification, the resistive termination unit 616 and the transmitter driver 604 are designed to reduce leakage current.

In the transmitter driver 604, two transistors MN1, MN2 form a differential pair with a transistor, MN0, which operates as a current source. As shown in FIG. 6, the transmitter driver 604 is implemented as a current mode logic (CML) driver in which current from a constant current generator is steered between two alternate paths depending on whether a logic zero or logic one is being represented. As a CML driver, the transmitter driver 604 has differential output driving capability (loading for MN2 is not shown in FIG. 6). The transistor, MN1, is connected to the transistors MN3, MN4 through a switch, S2. To reduce the leakage of the transmitter driver 604 in "off" mode, gates and sources of output devices are shorted together and are set to have a 2~3 threshold) $V_{TH}$/diode drop from the supply (2 $V_{TH}$/diode drop is demonstrated in FIG. 6 using transistors MN3, MN4). Consequently, the source voltages start to have the same potential as the gate when supply ramp-down happens, which reduce the leakage from the transistor, MN1, and the transistor, MN2, to the supply voltage and hence the negative voltage jump.

In the resistive termination unit 616 depicted in FIG. 6, the control circuit 638 is configured to control leakage of the PMOS transistor, MP0, (i.e., the termination switch) from the input/output terminal/pin 634. There are two major leakage paths for the PMOS transistor, MP0, one leakage path is through the switch channel of the PMOS transistor, MP0, and the other leakage path is through the nwell diode of the PMOS transistor, MP0. In some embodiments, leakage through the switch channel is reduced by floating the gate control for the PMOS transistor, MP0, when a supply ramp down event of the supply voltage, $V_{DD}$, is detected. As shown in FIG. 6, when supply ramp-down of the supply voltage, $V_{DD}$, occurs, the switch, S1, is turned off, which allows the gate voltage of the PMOS transistor, MP0, to be greater than the supply voltage for less leakage through the switch channel of the PMOS transistor, MP0. In some embodiments, the control circuit 638 controls the body (e.g., the nwell diode) and gate of the PMOS transistor, MP0. In some embodiments, to reduce the leakage of MP0 through the nwell diode, device sizes are optimized in the control circuit 638. Typically, devices with minimal width but 2 to 3 times of the minimum length are used to reduce the leakage.

Figure 7:
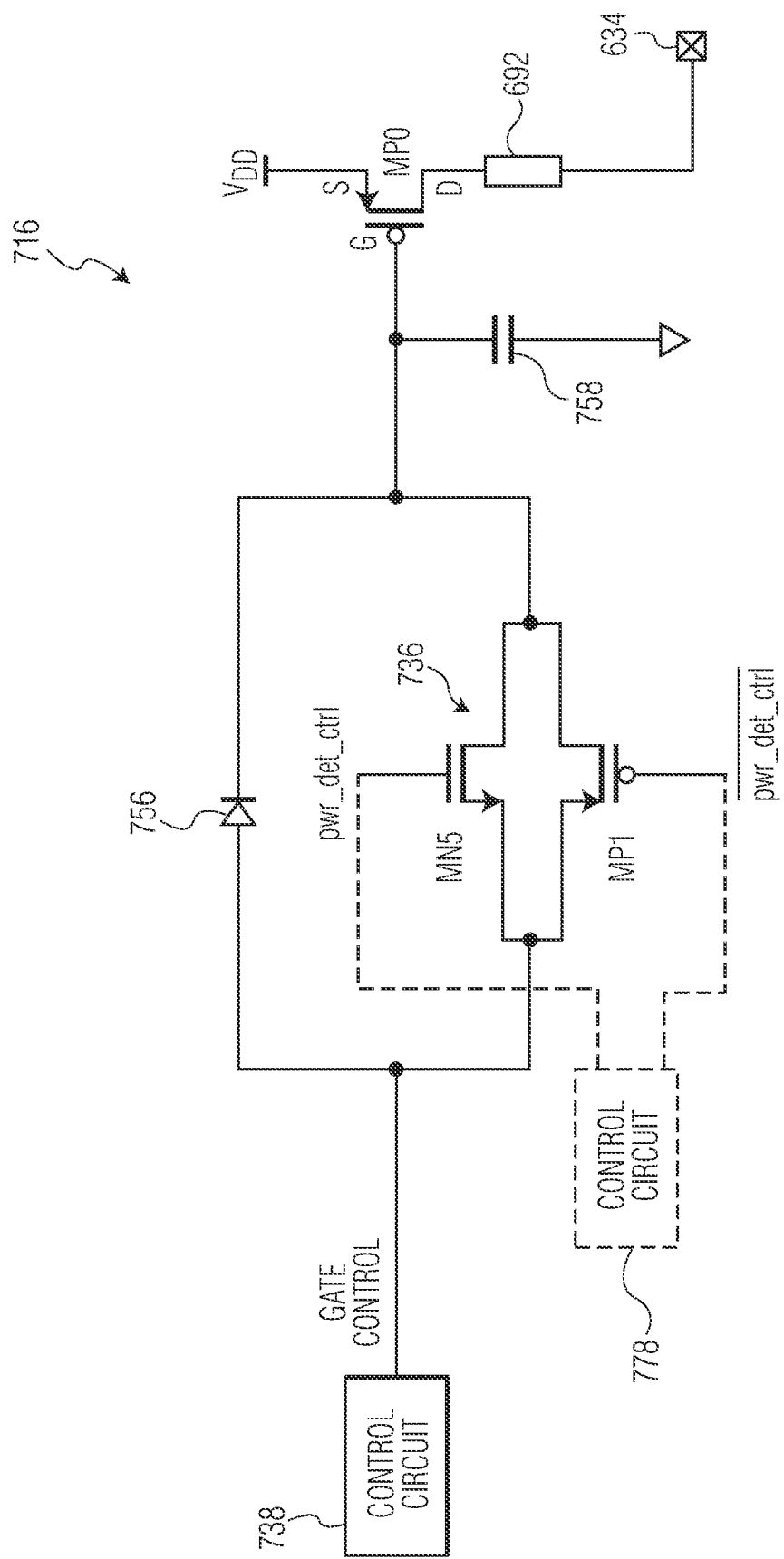
FIG. 7 depicts an embodiment of the resistive termination unit depicted in FIG. 6.

FIG. 7 depicts a resistive termination unit 716, which is an embodiment of the resistive termination unit 616 depicted in FIG. 6. However, the resistive termination unit 616 depicted in FIG. 6 is not limited to the embodiment shown in FIG. 7. In the embodiment depicted in FIG. 7, the resistive termination unit 716 includes the resistor 692 electrically connected to the input/output terminal/pin 634 of the redriver, the PMOS transistor MP0, which is connected to the resistor 692 and to the DC supply voltage $V_{DD}$ of the redriver, a transmission gate 736 formed by an NMOS transistor MN5 and a PMOS transistor MP1 and connected to the gate terminal (G) of the PMOS transistor MP0, and configured to be turned on or off in response to a change in the supply voltage $V_{DD}$ of the redriver (e.g., a ramp up event in which the supply voltage of the redriver increases from zero volt to a predefined voltage threshold $V_{DD}$ or a ramp down event in which in which the supply voltage of the redriver decreases from a predefined voltage threshold $V_{DD}$ to zero volt), a control circuit 738 connected to the gate terminal (G) of the PMOS transistor MP0, through the transmission gate 736 and configured to generate control signals for the PMOS transistor MP0 (e.g., control signals from the control circuit 738 going through the transmission gate 736 to reach the gate terminal (G) of the PMOS transistor MP0), a diode 756, and a capacitor 758. For example, when the transmission gate 736 is turned on (i.e., conductive), control signals from the control circuit 738 can reach the gate terminal (G) of the PMOS transistor MP0, and when the transmission gate 736 is turned off (i.e., non-conductive), control signals from the control circuit 738 cannot reach the gate terminal (G) of the PMOS transistor MP0. By turning on or off the transmission gate 736 connected to the PMOS transistor MP0, in response to a ramp up or a ramp down of the supply voltage $V_{DD}$ of the redriver, the control circuit 738 can selectively apply control signals to the PMOS transistor MP0 in response to a ramp up or a ramp down of the supply voltage $V_{DD}$ of the redriver. Consequently, the leakage current in the PMOS transistor MP0 can be reduced, and as a result, the abrupt voltage change or voltage jump at the input/output terminal/pin 634 of the redriver during supply voltage ramp-up or ramp-down can be reduced. In some embodiments, the control circuit 738 includes one or more processors, such as digital state machines, microcontrollers or CPUs configured to generate a control signal for the PMOS transistor MP0. In some embodiments, the resistive termination unit 716 includes a control circuit 778 configured to generate control signals, pwr_det_ctrl, $\overline{\text{pwr\_det\_ctrl}}$ (which is the inverted version of pwr_det_ctrl), for turning on or off the transmission gate 736 in response to the change in the supply voltage $V_{DD}$ of the redriver. Specifically, the control signal, pwr_det_ctrl, is applied to the gate terminal of the NMOS transistor MN5 of the transmission gate 736, and the control signal, $\overline{\text{pwr\_det\_ctrl}}$, is applied to the gate terminal of the PMOS transistor MP1 of the transmission gate 736. When the signal, pwr_det_ctrl, is at logical low, the termination switch (i.e., the PMOS transistor MP0) cannot be firmly turned off due to the diode drop. However, the leakage in the termination switch MP0 is limited due to the presence of the diode 756. The capacitor 758, which is connected to a reference voltage (e.g., the ground), is used to hold the voltage when the transmission gate 736 is turned off. The transmission gate 736 can be controlled by a derivative from chip-top level power-good/POR signal, which can detect a power/supply ramp-down event accurately in a timely manner. A Power-On-Reset (POR) circuit typically has +/−20% accuracy for the thresholds with startup and response times of hundreds of microseconds (μs) due to its lower power nature. A power-good circuit based on comparator, on the other hand, can have a +/−<3% accuracy and a response time of less than 10 us even with lower current consumption. However, a power-good circuit still needs to wait tens or hundreds of us after the supply ramp-up for the bias and the voltage reference to be ready. As a result, power-good/POR output cannot be directly used to control the switch, S1, in FIG. 6 and the transmission gate 736 in FIG. 7 as the control signal needs to have, for example, a startup/response of less than 10 us and a +/−<3% accuracy during supply ramp-up/ramp-down events in most applications.

Figure 8:
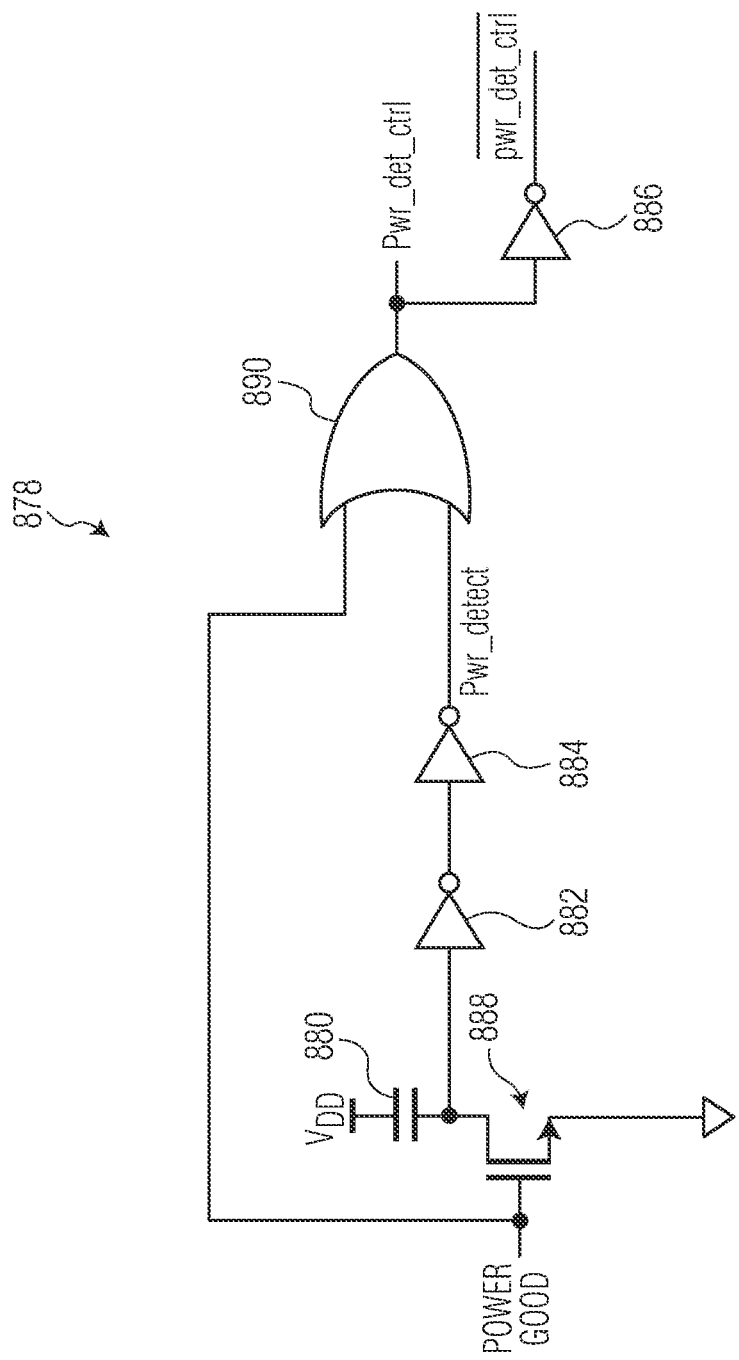
FIG. 8 depicts an embodiment of a control circuit of the resistive termination unit depicted in FIG. 7.

FIG. 8 depicts a control circuit 878, which is an embodiment of the control circuit 778 of the resistive termination unit 716 depicted in FIG. 7. However, the control circuit 778 depicted in FIG. 7 is not limited to the embodiment shown in FIG. 8. In the embodiment depicted in FIG. 8, the control circuit 878 includes a capacitor 880 connected to a supply voltage, $V_{DD}$, of a redriver, three inverters 882, 884, 886, a switch that is implemented as a transistor 888, and an OR gate 890 connected between the inverters 884, 886. The control circuit 878 in FIG. 8 can be used to detect a ramp up or down event of the supply voltage, $V_{DD}$, which is connected to the capacitor 880. For example, a signal, "pwr_detect," is asserted (i.e., logic 1) when a supply ramp-up event occurs by coupling the supply voltage, $V_{DD}$, to the inverter input via the large capacitor 880. The inverter 882 is skewed to facilitate the ramp-up detection. The output signal, pwr_detect, of the inverter 884 is de-asserted (i.e., logic 0) by a power-good signal, which may be generated from a traditional comparator based power-good circuit (not shown). The power-good signal may be provided by a computer power supply to indicate to a corresponding motherboard that all of the voltages are within specification and that the system may proceed to boot and operate. For example, Advanced Technology eXtended (ATX) specifications define the Power-Good signal as a +5-volt (V) signal generated in the power supply when it has passed its internal self-tests and the outputs have stabilized. The OR gate performs an OR logic operation on the power-good signal, which may be generated from a traditional comparator based power-good circuit (not shown), and the output signal, pwr_detect, of the inverter 884 to generate a control signal, pwr_det_ctrl, for the transmission gate 736. The inverter 886 is configured to invert the control signal, pwr_det_ctrl, to generate a control signal, $\overline{\text{pwr\_det\_ctrl}}$, for the transmission gate 736.

Figure 9:
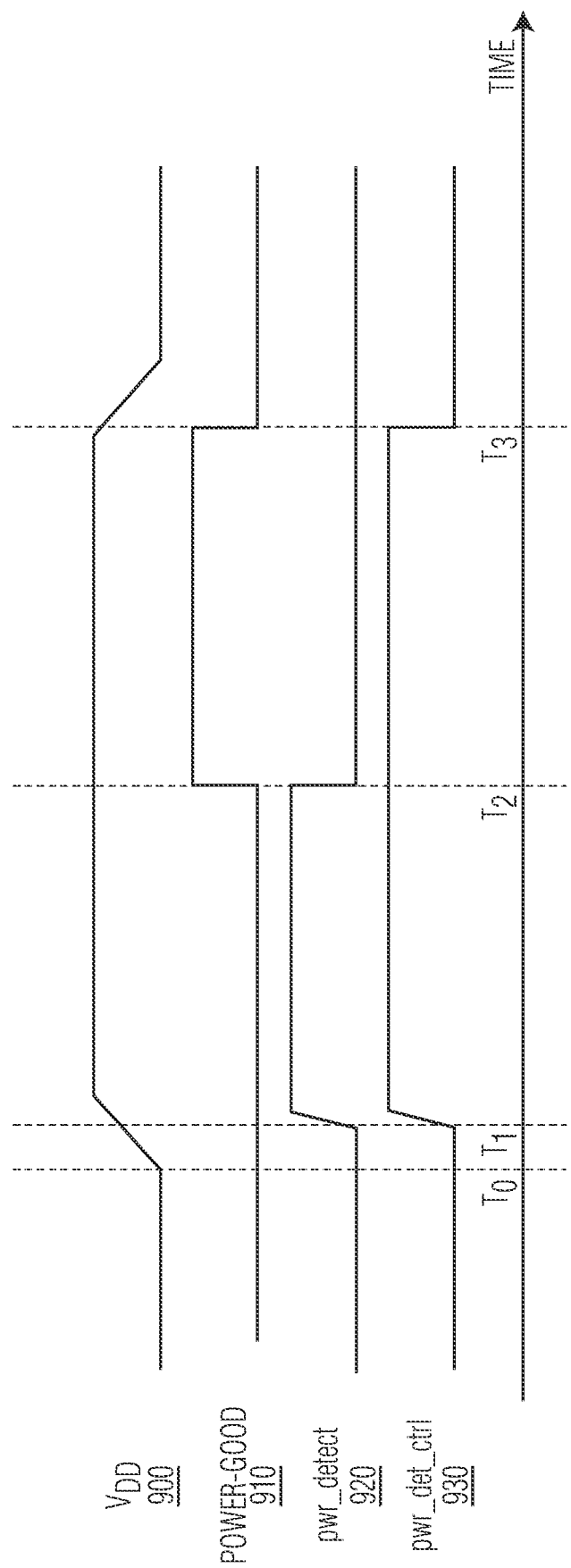
FIG. 9 illustrates a timing diagram of the control circuit depicted in FIG. 8.

FIG. 9 illustrates a timing diagram of the control circuit 878 depicted in FIG. 8. As illustrated in FIG. 9, the supply voltage, $V_{DD}$, which is represented by a waveform 900, ramps up at time point, $T_0$. A fast ramp-up detection signal, pwr_detect, which is represented by a waveform 920, is generated to capture the supply ramp-up event. The signal, pwr_detect, is used for fast ramp-up detection while the power-good signal, which is represented by a waveform 910, is used as for slow ramp-up detection. As a derivative of the pwr_detect and the power-good signal, pwr_det_ctrl, which is represented by a waveform 930, is generated to control the switch, S1, in FIG. 6 or the transmission gate 736 in FIG. 7, for the entire supply ramp up event. Specifically, the signal, pwr_detect, and the signal, pwr_det_ctrl, increase from logic zero to logic one at time point, $T_1$. The signal, pwr_detect, decreases from logic one to logic zero at time point, $T_2$, while the power-good signal increases from logic zero to logic one at time point, $T_2$. The signal, pwr_det_ctrl, and the power-good signal decreases from logic one to logic zero at time point, $T_3$.

Figure 10:
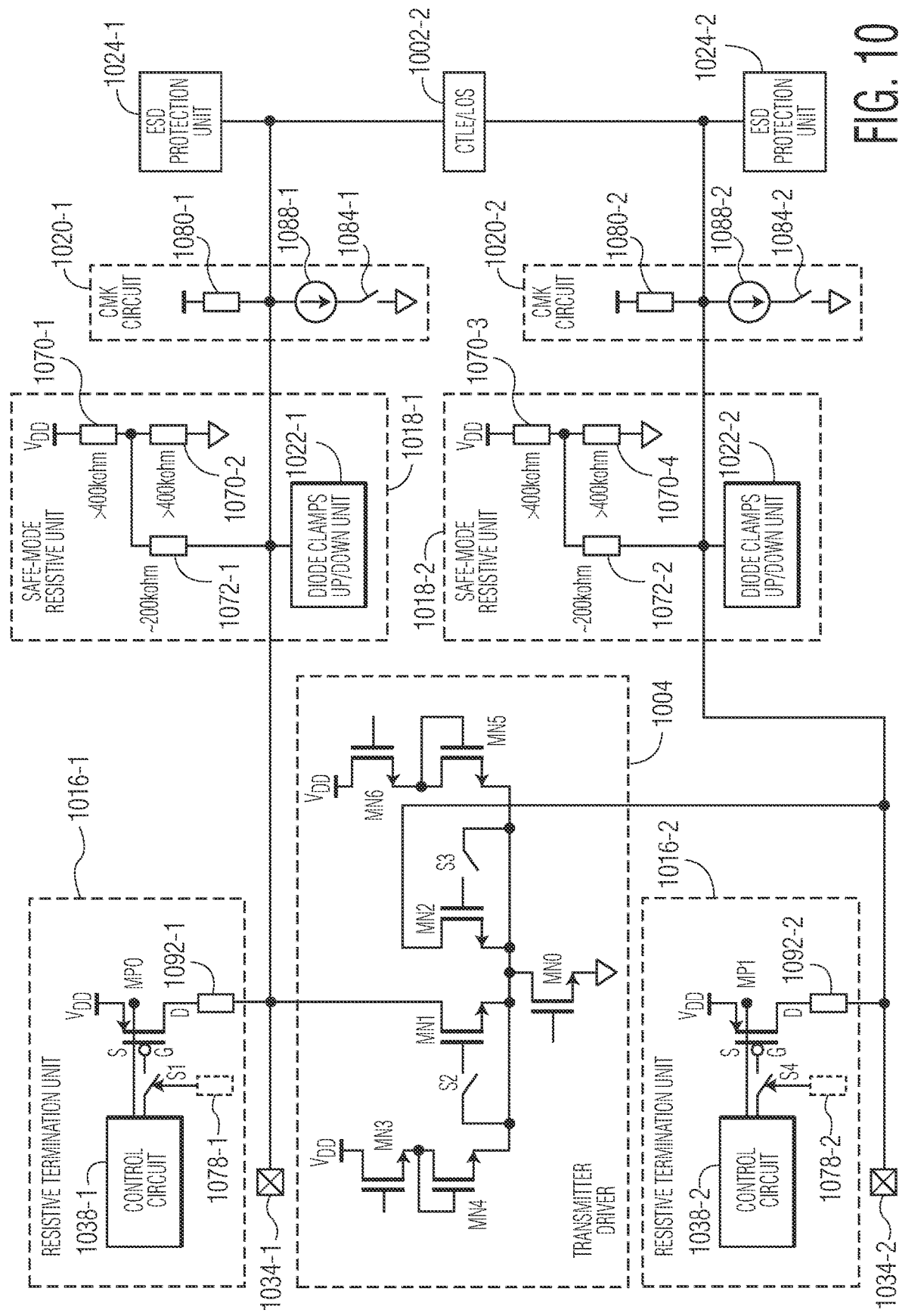
FIG. 10 depicts resistive termination units, a differential transmitter driver, safe-mode resistive units, CMK circuits, a CTLE/LOS, diode or clamp up/down units, and ESD protection units that are connected to input/output terminals/pins of a redriver.

FIG. 10 depicts resistive termination units 1016-1, 1016-2, a differential transmitter driver 1004, safe-mode resistive unit 1018-1, 1018-2, CMK circuits 1020-1, 1020-2, a CTLE/LOS 1002, diode or clamp up/down units 1022-1, 1022-2, and ESD protection unit 1024-1, 1024-2 that are connected to input/output terminals/pins 1034-1, 1034-2 of a redriver (e.g., the redriver 100 depicted in FIG. 1 or the redriver 200 depicted in FIG. 2). In the embodiment depicted in FIG. 10, the resistive termination unit 1016-1 is electrically connected to the differential transmitter driver 1004 and to the input/output terminal/pin 1034-1 of the redriver, while the resistive termination unit 1016-2 is electrically connected to the differential transmitter driver 1004 and to the input/output terminal/pin 1034-2 of the redriver. The resistive termination unit 1016-1 includes a resistor 1092-1 electrically connected to the input/output terminal/pin 1034-1 of the redriver, a switch that is implemented as a PMOS transistor, MP0, which is connected to the resistor 1092-1 through the drain terminal, D, of the PMOS transistor, MP0, and to a DC supply voltage, $V_{DD}$, of the redriver through the source terminal, S, of the PMOS transistor, MP0, a switch, S1, connected to the gate terminal, G, of the PMOS transistor, MP0, and configured to be turned on or off in response to a change in the supply voltage, $V_{DD}$, of the redriver (e.g., a ramp up event in which the supply voltage of the redriver increases from zero volt to a predefined voltage threshold, $V_{DD}$, or a ramp down event in which in which the supply voltage of the redriver decreases from a predefined voltage threshold, $V_{DD}$, to zero volt), and a control circuit 1038-1 connected to the gate terminal, G, of the PMOS transistor, MP0, through the switch, S1, and configured to generate control signals for the switch S1 (e.g., control signals from the control circuit 1038-1 going through the switch, S1, to reach the gate terminal, G, of the PMOS transistor, MP0). For example, when the switch, S1, is turned on (i.e., conductive), control signals from the control circuit 1038-1 can reach the gate terminal, G, of the PMOS transistor, MP0, and when the switch, S1, is turned off (i.e., non-conductive), control signals from the control circuit 1038-1 cannot reach the gate terminal, G, of the PMOS transistor, MP0. By turning on or off the switch, S1, connected to the PMOS transistor, MP0, in response to a ramp up or a ramp down of the supply voltage, $V_{DD}$, of the redriver, the control circuit 1038-1 can selectively apply control signals to the PMOS transistor, MP0, in response to a ramp up or a ramp down of the supply voltage, $V_{DD}$, of the redriver. Consequently, the leakage current in the PMOS transistor, MP0, can be reduced, and as a result, the abrupt voltage change or voltage jump at the input/output terminal 1034-1 of the redriver during supply voltage ramp-up or ramp-down can be reduced. The resistance value of the resistor 1092-1 may be around of 50Ω (e.g., within +30% of 50Ω). In some embodiments, the control circuit 1038-1 includes one or more processors, such as digital state machines, microcontrollers or CPUs configured to generate a control signal for the PMOS transistor, MP0. In some embodiments, the resistive termination unit 1016-1 includes a control circuit 1078-1 configured to generate a control signal for turning on or off the switch, S1, in response to the change in the supply voltage, $V_{DD}$, of the redriver. The resistive termination unit 1016-2 includes a resistor 1092-2 electrically connected to the input/output terminal/pin 1034-2 of the redriver, a switch that is implemented as a PMOS transistor, MP1, which is connected to the resistor 1092-2 through the drain terminal, D, of the PMOS transistor, MP1, and to the DC supply voltage, $V_{DD}$, of the redriver through the source terminal, S, of the PMOS transistor, MP1, a switch, S4, connected to the gate terminal, G, of the PMOS transistor, MP1, and configured to be turned on or off in response to a change in the supply voltage, $V_{DD}$, of the redriver (e.g., a ramp up event in which the supply voltage of the redriver increases from zero volt to a predefined voltage threshold, $V_{DD}$, or a ramp down event in which in which the supply voltage of the redriver decreases from a predefined voltage threshold, $V_{DD}$, to zero volt), and a control circuit 1038-2 connected to the gate terminal, G, of the PMOS transistor, MP1, through the switch, S4, and configured to generate control signals for the switch, S4 (e.g., control signals from the control circuit 1038-2 going through the switch, S4, to reach the gate terminal, G, of the PMOS transistor, MP1). For example, when the switch, S4, is turned on (i.e., conductive), control signals from the control circuit 1038-2 can reach the gate terminal, G, of the PMOS transistor, MP1, and when the switch, S4, is turned off (i.e., non-conductive), control signals from the control circuit 1038-2 cannot reach the gate terminal, G, of the PMOS transistor, MP1. By turning on or off the switch, S4, connected to the PMOS transistor, MP1, in response to a ramp up or a ramp down of the supply voltage, $V_{DD}$, of the redriver, the control circuit 1038-2 can selectively apply control signals to the PMOS transistor, MP1, in response to a ramp up or a ramp down of the supply voltage, $V_{DD}$, of the redriver. Consequently, the leakage current in the PMOS transistor, MP1, can be reduced, and as a result, the abrupt voltage change or voltage jump at the input/output terminal 1034-2 of the redriver during supply voltage ramp-up or ramp-down can be reduced. The resistance value of the resistor 1092-2 may be around of 50Ω (e.g., within ±30% of 50Ω). In some embodiments, the control circuit 1038-2 includes one or more processors, such as digital state machines, microcontrollers or CPUs configured to generate a control signal for the PMOS transistor, MP1. In some embodiments, the resistive termination unit 1016-2 includes a control circuit 1078-2 configured to generate a control signal for turning on or off the switch, S4, in response to the change in the supply voltage, $V_{DD}$, of the redriver. In some embodiments, the CTLE/LOS 1002 includes a fully differential LoS detector and a fully differential CTLE that are connected together.

In the embodiment depicted in FIG. 10, the safe-mode resistive unit 1018-1 includes resistors 1070-1, 1070-2, 1072-1, while the safe-mode resistive unit 1018-2 includes resistors 1070-3, 1070-4, 1072-2. In some embodiments, the safe-mode resistive unit 1018-1 or 1018-2 includes one or more switches. In the embodiment depicted in FIG. 10, the CMK circuit 1020-1 includes a resistor 1080-1, a current source 1088-1, and a switch 1084-1, while the CMK circuit 1020-2 includes a resistor 1080-2, a current source 1088-2, and a switch 1084-2. In some embodiments, to minimize the abrupt voltage change during ramp up or ramp down of the supply voltage, $V_{DD}$, of the redriver, leakage for all components connected to the input/output terminal/pins 1034-1, 1034-2 is reduced or minimized. Device sizes for the resistive termination units 1016-1, 1016-2, the differential transmitter driver 1004, the safe-mode resistive units 1018-1, 1018-2, the CMK circuits 1020-1, 1020-2, the CTLE/LOS 1002, and the diode or clamp up/down units 1020-1, 1020-2 can be optimized or reduced to have minimal leakage. To meet the ramp up or ramp down voltage jump specification, the resistive termination units 1016-1, 1016-2 and the differential transmitter driver 1004 are designed to reduce leakage current.

In the differential transmitter driver 1004, two transistors MN1, MN2 form a differential pair with a transistor, MN0, which operates as a current source. As shown in FIG. 10, the differential transmitter driver 1004 is implemented as a current mode logic (CML) driver in which current from a constant current generator is steered between two alternate paths depending on whether a logic zero or logic one is being represented. As a CML driver, the differential transmitter driver 1004 has differential output driving capability. The transistor MN1 is connected to transistors MN3, MN4 through a switch S2, while the transistor MN2 is connected to the transistors MN5, MN6 through a switch S3. To reduce the leakage of the differential transmitter driver 1004 in "off" mode, gates and sources of output devices are shorted together and are set to have a 2~3 $V_{TH}$/diode drop from the supply (2 $V_{TH}$/diode drop is demonstrated in FIG. 10 using the transistors MN3, MN4 or the transistors MN5, MN6). Consequently, the source voltages start to have the same potential as the gate voltages when supply ramp-down happens, which reduce the leakage from the transistor, MN1, and the transistor, MN2, to the supply voltage and hence the negative voltage jump.

In the resistive termination unit 1016-1 or 1016-2 depicted in FIG. 10, the control circuit 1038-1 or 1038-2 is configured to control leakage of the PMOS transistor MP0 or MP1 (i.e., the termination switch) from the input/output terminal/pin 1034-1 or 1034-2. There are two major leakage paths for the PMOS transistor MP0 or MP1, one leakage path is through the switch channel of the PMOS transistor MP0 or MP1, and the other leakage path is through the nwell diode of the PMOS transistor MP0 or MP1. In some embodiments, leakage through the switch channel is reduced by floating the gate control for the PMOS transistor MP0 or MP1, when a supply ramp down event of the supply voltage, $V_{DD}$, is detected. As shown in FIG. 10, when a supply ramp-down of the supply voltage, $V_{DD}$, occurs, the switch S1 or S4 is turned off, which allows the gate voltage of the PMOS transistor MP0 or MP1 to be greater than the supply voltage for less leakage through the switch channel of the PMOS transistor MP0 or MP1. In some embodiments, the control circuit 1038-1 or 1038-2 controls the body (e.g., the nwell diode) and gate of the PMOS transistor, MP0 or MP1.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A resistive termination unit for a redriver, the resistive termination unit comprising:
   a resistor coupled to an input/output terminal of the redriver;
   a first switch coupled to the resistor and to a supply voltage of the redriver;
   a second switch coupled to the first switch and configured to be turned on or off in response to a change in the supply voltage of the redriver; and
   a control circuit coupled to the first switch through the second switch and configured to generate a control signal for the first switch;
   wherein the control circuit is coupled to a body of the first switch and configured to generate a second control signal for a body terminal or pin of the first switch.

2. The resistive termination unit of claim 1, further comprising
a second control circuit configured to generate a second control signal for turning on or off the second switch in response to the change in the supply voltage of the redriver.

3. The resistive termination unit of claim 2,
wherein the second control circuit comprises a capacitor, a third switch, a plurality of inverters, and an OR gate.

4. The resistive termination unit of claim 3,
wherein the capacitor is connected to the supply voltage of the redriver,
wherein the third switch is connected between the capacitor and a reference voltage, and
wherein the inverters are connected between the capacitor, the third switch, and the OR gate.

5. The resistive termination unit of claim 4,
wherein the third switch comprises a transistor, and
wherein a power good signal or a power-on reset (POR) signal of the redriver is applied to a gate terminal of the transistor.

6. The resistive termination unit of claim 1,
wherein the second switch comprises a transmission gate.

7. The resistive termination unit of claim 6, further comprising
a second control circuit configured to generate a second control signal and
a third control signal for turning on or off the transmission gate in response to the change in the supply voltage of the redriver, and
wherein the second control signal is an inverted version of the third control signal.

8. The resistive termination unit of claim 6, further comprising
a diode device connected to the first switch and to the transmission gate.

9. The resistive termination unit of claim 1, further comprising
a capacitor connected between the first switch and a reference voltage.

10. The resistive termination unit of claim 9,
wherein the reference voltage is zero volt.

11. The resistive termination unit of claim 1,
wherein the first switch comprises a P-channel metal-oxide-semiconductor field-effect transistor (MOSFET) (PMOS) transistor, and
wherein the second switch is connected to a gate terminal of the PMOS transistor.

12. The resistive termination unit of claim 1,
wherein the change in the supply voltage of the redriver comprises a ramp up event in which the supply voltage of the redriver increases from zero volt to a predefined voltage threshold.

13. The resistive termination unit of claim 1,
wherein the change in the supply voltage of the redriver comprises a ramp down event in which in which the supply voltage of the redriver decreases from a predefined voltage threshold to zero volt.

14. The resistive termination unit of claim 1,
wherein the supply voltage of the redriver comprises a direct current (DC) voltage.

15. A resistive termination unit for a redriver, the resistive termination unit comprising:
a resistor connected to an input/output terminal of the redriver;
a P-channel metal-oxide-semiconductor field-effect transistor (MOSFET) (PMOS) transistor connected to the resistor and a supply direct current (DC) voltage of the redriver;
a transmission gate connected to a gate terminal of the PMOS transistor and configured to be turned on or off in response to a change in the supply DC voltage of the redriver; and
a control circuit connected to the PMOS transistor through the transmission gate and configured to generate a control signal for the PMOS transistor.

16. The resistive termination unit of claim 15, further comprising
a second control circuit configured to generate a second control signal and
a third control signal for turning on or off the transmission gate in response to the change in the supply DC voltage of the redriver, and
wherein the second control signal is an inverted version of the third control signal.

17. The resistive termination unit of claim 15, further comprising:
a diode device connected to the PMOS transistor and to the transmission gate; and
a capacitor connected between the PMOS transistor and ground.

18. The resistive termination unit of claim 15,
wherein the change in the supply DC voltage of the redriver comprises a ramp up event in which the supply DC voltage of the redriver increases from zero volt to a predefined voltage threshold or a ramp down event in which in which the supply DC voltage of the redriver decreases from the predefined voltage threshold to zero volt.

19. A redriver comprising:
a Continuous Time Linear Equalizer (CTLE) configured to perform signal equalization;
a transmitter driver configured to generate a driver signal in response to the signal equalization; and
the resistive termination unit of claim 1 coupled to the transmitter driver and to an input or output terminal of the redriver.

20. A resistive termination unit for a redriver, the resistive termination unit comprising:
a resistor coupled to an input or an output terminal of the redriver;
a first switch coupled to the resistor and to a supply voltage of the redriver;
a second switch coupled to the first switch and configured to be turned on or off in response to a change in the supply voltage of the redriver; and
a control circuit coupled to the first switch through the second switch and configured to generate a control signal for the first switch;
wherein the second switch comprises a transmission gate.

* * * * *